(12) United States Patent
Kuroda et al.

(10) Patent No.: US 10,944,238 B2
(45) Date of Patent: Mar. 9, 2021

(54) OPTICAL MEMBER HOLDING DEVICE, SEMICONDUCTOR LASER DEVICE, METHOD OF MANUFACTURING OPTICAL MEMBER HOLDING DEVICE, AND METHOD OF MANUFACTURING SEMICONDUCTOR LASER DEVICE

(71) Applicant: NICHIA CORPORATION, Anan (JP)

(72) Inventors: Hiroaki Kuroda, Anan (JP); Tomonori Miyoshi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 136 days.

(21) Appl. No.: 16/190,507

(22) Filed: Nov. 14, 2018

(65) Prior Publication Data
US 2019/0148909 A1    May 16, 2019

(30) Foreign Application Priority Data
Nov. 14, 2017  (JP) .............................. JP2017-219238

(51) Int. Cl.
*H01S 5/022* (2006.01)
*H01S 5/02212* (2021.01)
(Continued)

(52) U.S. Cl.
CPC ...... *H01S 5/02296* (2013.01); *H01S 5/02236* (2013.01); *H01S 5/02252* (2013.01);
(Continued)

(58) Field of Classification Search
CPC ............. H01S 5/02296; H01S 5/02252; H01S 5/02236; H01S 5/02212; H01S 5/005; H01S 5/02469
See application file for complete search history.

(56) References Cited

U.S. PATENT DOCUMENTS

| 2002/0154730 A1 | 10/2002 | Shiraishi |
| 2014/0153276 A1* | 6/2014 | Nozaki ................ F21S 41/43 |
| | | 362/551 |

(Continued)

FOREIGN PATENT DOCUMENTS

| JP | S62-086315 A | 4/1987 |
| JP | H10-160996 A | 6/1998 |

(Continued)

*Primary Examiner* — Xinning (Tom) Niu
(74) *Attorney, Agent, or Firm* — Global IP Counselors, LLP

(57) ABSTRACT

An optical member holding device includes a holding member, an optical member and an elastic member. The holding member has a recess defined by one or more lateral surfaces and a bottom surface with a through-hole opening at the bottom surface. The optical member is disposed on the bottom surface of the recess, and includes a light transmissive part. The optical member has an upper surface and one or more lateral surfaces. The elastic member consists of an inorganic material. The elastic member includes a main part disposed on the upper surface of the optical member, and a plurality of supporting parts each extending outward and bending downward to be in contact with the one or more lateral surfaces of the recess and the one or more lateral surfaces of the optical member to exert elastic force that secures the optical member in a predetermined location in the recess.

13 Claims, 12 Drawing Sheets

(51) Int. Cl.
  *H01S 5/00*  (2006.01)
  *H01S 5/024*  (2006.01)
(52) U.S. Cl.
  CPC .......... *H01S 5/005* (2013.01); *H01S 5/02212* (2013.01); *H01S 5/02469* (2013.01)

(56) References Cited

U.S. PATENT DOCUMENTS

| | | | |
|---|---|---|---|
| 2015/0292673 A1 | 10/2015 | Huber | |
| 2016/0186936 A1* | 6/2016 | Kiyota | ................ H01S 5/02296 362/84 |
| 2017/0063032 A1 | 3/2017 | Morizumi et al. | |

FOREIGN PATENT DOCUMENTS

| | | |
|---|---|---|
| JP | 2002-318334 A | 10/2002 |
| JP | 2004-165398 A | 6/2004 |
| JP | 2005-345654 A | 12/2005 |
| JP | 2009-016456 A | 1/2009 |
| JP | 2010-078920 A | 4/2010 |
| JP | 2016-505868 A | 2/2016 |
| JP | 2017045936 A | 3/2017 |

* cited by examiner

OPTICAL MEMBER HOLDING DEVICE, SEMICONDUCTOR LASER DEVICE, METHOD OF MANUFACTURING OPTICAL MEMBER HOLDING DEVICE, AND METHOD OF MANUFACTURING SEMICONDUCTOR LASER DEVICE

CROSS-REFERENCE TO RELATED PATENT APPLICATION

The present application claims priority under 35 U. S. C. § 119 to Japanese Patent Application No. 2017-219238, filed Nov. 14, 2017. The contents of Japanese Patent Application No. 2017-219238 are incorporated herein by reference in their entirety.

BACKGROUND

Technical Field

The present disclosure relates to an optical member holding device, a semiconductor laser device, a method of manufacturing the optical member holding device, and a method of manufacturing the semiconductor laser device.

Description of Related Art

There has been proposed an optical unit having an optical member, a holding member to hold the optical member, and an engaging part to be fit in a recess formed in an outer circumference of the optical member or in an inner circumference of the holding member. In order to firmly fix the optical member to the holding member, the engaging part is irradiated with a laser light and melted to weld the optical member and the holding member. (For example, see Japanese Unexamined Patent Application Publication No. 2005-345654).

SUMMARY

However, the engaging part of such a conventional optical unit consists of a thermoplastic resin (i.e., organic material) that may reduce reliability in terms of heat-resisting property, mechanical strength, and other properties. Moreover, relatively accurate positional adjustment of the optical member to the holding member is needed when disposing the optical member.

Such disadvantages can be overcome according to certain embodiments of the present invention as illustrated below.

An optical member holding device includes a holding member, an optical member and an elastic member. The holding member has a recess defined by one or more lateral surfaces and a bottom surface with a through-hole opening at the bottom surface of the recess. The optical member is disposed on the bottom surface of the recess, and includes a light transmissive part configured to allow at least a portion of light that enters the through-hole of the holding member to pass through. The optical member has an upper surface and one or more lateral surfaces. The elastic member consists of an inorganic material. The elastic member includes a main part disposed on the upper surface of the optical member, and a plurality of supporting parts each extending outward from the main part and bending downward so as to be in contact with the one or more lateral surfaces of the recess and the one or more lateral surfaces of the optical member to exert elastic force that secures the optical member in a predetermined location in the recess.

An optical member holding device includes a holding member, an optical member, and an elastic member. The holding member has a recess defined by one or more lateral surfaces and a bottom surface with a through-hole opening at the bottom surface of the recess. The optical member is disposed on the bottom surface of the recess, and including a light transmissive part configured to allow at least a portion of light that enters the through-hole of the holding member to pass through. The optical member has an upper surface and one or more lateral surfaces. The elastic member consists of an inorganic material. The elastic member has a wavelike shape in a plan view and disposed between the one or more lateral surfaces of the recess and the one or more lateral surfaces of the optical member so as to be in contact with the one or more lateral surfaces of the recess and the one or more lateral surfaces of the optical member to exert elastic force that secures the optical member to a predetermined location in the recess.

A semiconductor laser device includes either one of the optical member holding devices as described above, a base, a semiconductor laser element disposed above the base, and a cover disposed above the base, the cover including an upper surface with a through-hole opening at the upper surface to allow light from the semiconductor laser element to pass through. The optical member holding device is disposed above the cover such that light emitted from the semiconductor laser element passes through the through-hole of the cover and the through-hole of the holding member to enter the light-transmissive part.

A method of manufacturing an optical member holding device includes: providing a holding member having a recess defined by one or more lateral surfaces and a bottom surface with a through-hole opening at the bottom surface of the recess, an optical member including a light-transmissive part configured to allow at least a portion of light that enters the through-hole to pass through, the optical member having an upper surface and one or more lateral surfaces, and an elastic member consisting of an inorganic material, the elastic member including a main part and a plurality of supporting parts with each of the plurality of supporting panrts extending outward from the main part and bending downward; and disposing the optical member in the recess of the holding member and disposing the main part of the elastic member on the upper surface of the optical member such that the plurality of the supporting parts are in contact with the one or more lateral surfaces of the recess and the one or more lateral surfaces of the optical, member to exert elastic force that secures the optical member in a predetermined location in the recess.

According to the present disclosure, an optical member holding device and a semiconductor laser device having high reliability in terms of heat-resisting properties and mechanical strength can be provided. Also, the present disclosure can provide a method of manufacturing an optical member holding device or a semiconductor laser device in which an optical member can be disposed without highly precise positioning to a holding member.

DETAILED DESCRIPTION OF EMBODIMENTS

Semiconductor Laser Device 1

According to First Embodiment

Figure 1A:
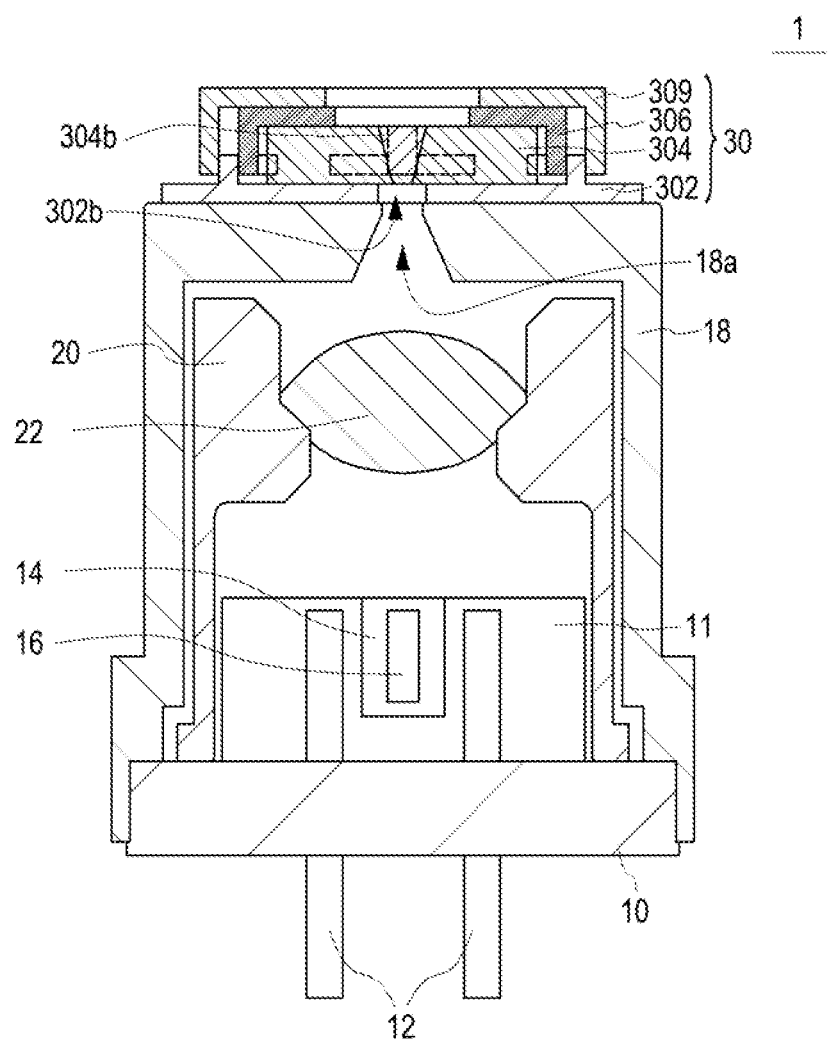
FIG. 1A is a schematic cross-sectional view of a semiconductor laser device according to a first embodiment of the present invention.
Figure 1B:
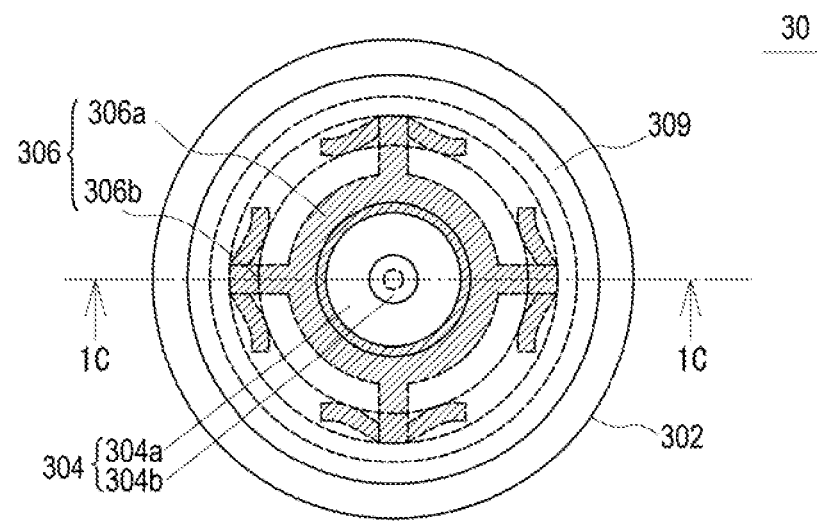
FIG. 1B is a schematic plan view of an optical member holding device according to the first embodiment of the present invention.
Figure 1C:
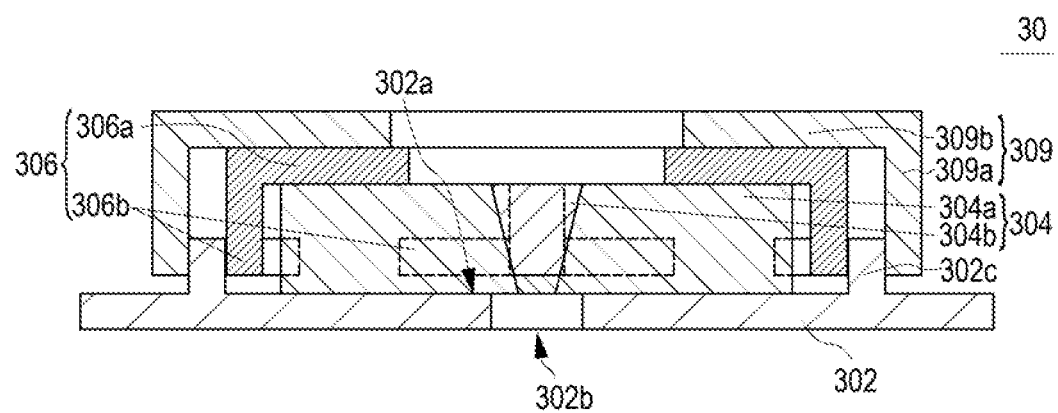
FIG. 1C is a cross sectional view taken along line 1C-1C in FIG. 1B.

FIG. 1A is a schematic cross-sectional view of a semiconductor laser device 1 according to a first embodiment of the present invention. FIG. B is a schematic plan view of an optical member holding device 30 according to the first embodiment, and FIG. 1C is a cross sectional view taken along line 1C-1C in FIG. 1B. In FIG. 13B, hatching is used to indicate an elastic member 306. In the cross-sectional views and the plan views, portion(s) of member(s) shown through other member(s) are illustrated by broken lines to clarify the configuration of the members.

As shown in FIG. 1A, the semiconductor laser device 1 includes a base 10, a semiconductor laser element 16 disposed above the base 10, a cover 18 disposed above the base 10, and an optical member holding device 30. The cover 18 has an upper surface defining a through-hole 18a to allow light from the semiconductor laser element 16 to pass through. The optical member holding device 30 is disposed above the cover 18 such that light emitted from the semiconductor laser element 16 passes through the through hole 18a of the cover 18 and the through hole 302b of the holding member 30 and enters the light-transmissive part 304b of the optical member 304. Each constituent member will be described in detail below.

Optical Member Holding Device 30

The optical member holding device 30 is disposed above the cover 18. As shown in FIG. 1A to FIG. 1C, the optical member holding device 30 according to the first embodiment includes a holding member 302, an optical member 304, an elastic member 306, and a pressing part 309.

Holding Member 302

Figure 2A:
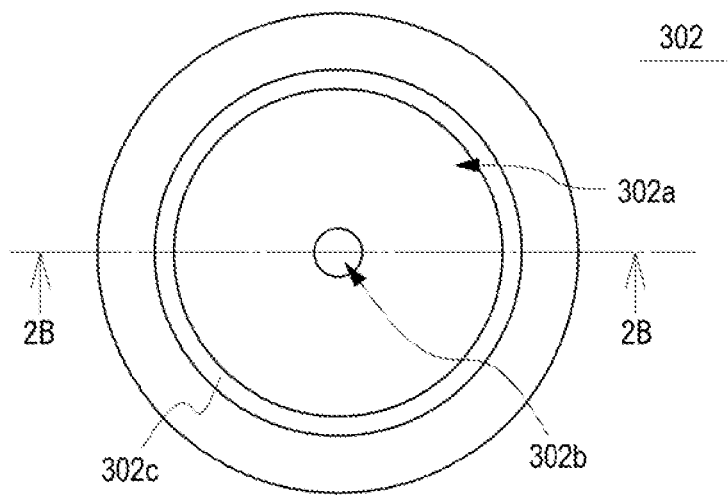
FIG. 2A is a schematic plan view of a holding member according to the first embodiment of the present invention.
Figure 2B:
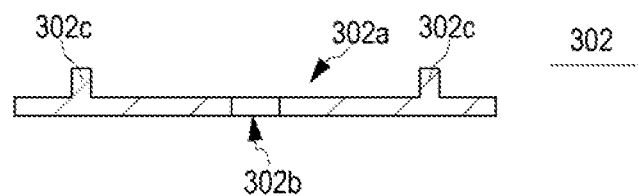
FIG. 2B is a cross sectional view taken along line 2B-2B in FIG. 2A.

FIG. 2A is a schematic plan view of the holding member 302 according to the first embodiment, and FIG. 2B is a cross sectional view taken along line 2B-2B in FIG. 2A. As shown in FIG. 2A and FIG. 2B, the holding member 302 is formed with a recess 302a. The recess 302a is defined by one or more lateral surfaces and a bottom surface, and a through-hole 302b is formed in the bottom surface of the recess. The holding member 302 has a wall 302c having one or more outer lateral surfaces and one or more inner lateral surfaces, and the one or more inner lateral surfaces define the one or more lateral surfaces of the recess 302a. The through hole 302b is formed in an approximately center of the bottom surface of the recess 302a. The shape of the opening defining the through-hole 302b has a circular shape as shown in FIG. 2A, but alternatively can have an elliptic shape or a polygonal shape such as a triangular shape, a quadrangular shape, or the like. The opening diameter or opening width of the through-hole 302b is preferably greater than or equal to 0.2 mm. With this arrangement, light passed through the through-hole 302b can be prevented from being blocked by the holding member 302. The opening diameter or opening width of the through-hole 302b is preferably less than or equal to 3.5 mm. With this arrangement, a contact area between the optical member 304 and the bottom surface of the recess 302a of the holding member 302 can be increased, and heat dissipation from the optical member 304 to the holding member 302 can be increased. The through-hole 302b may have a same predetermined diameter throughout a thickness direction, of the holding member 302.

The bottom surface of the recess 302a is preferably flat. With this arrangement, when a lower surface of the optical member 304 is flat, a contact area between the optical member 304 and the bottom surface of the recess 302a of the holding member 302 can be increased, and heat dissipation from the optical member 304 to the holding member 302 can be increased. For a similar reason, the bottom surface of the recess 302a preferably has a diameter or a width greater than a height of the one or more lateral surfaces of the recess 302a. An angle between the bottom surface of the recess 302a and the one or more lateral surfaces of the recess 302a is preferably in a range of 60 degrees to 100 degrees, more preferably at a right angle. With the angle between the bottom surface and the one or more lateral surfaces of the recess 302a in a range of 60 degrees to 1.00 degrees, the elastic member 306 can be easily disposed in the recess 302a while making it less likely for the elastic member 306 to be detached from the recess 302a. When the bottom surface and the one or more lateral surfaces of the recess 302a is at a right angle, the elastic member 306 can be more easily disposed in the recess 302a while making it less likely for the elastic member 306 to be detached from the recess 302a.

The height of the one or more lateral surfaces 302c of the recess is preferably greater than or equal to 0.5 mm. With this arrangement, a sufficient contact area between the elastic member 306 and the one or more lateral surfaces of the recess 302a can be obtained, which facilitate securing the elastic member 306 in the recess 302a. The wall 302c of the holding member 302 preferably has a height of less than or equal to 2 mm. With this arrangement, the size of the optical member holding device 30 can be reduced.

The holding member 302 preferably consists of an inorganic material. More specifically, an inorganic material containing a metal, for example, an inorganic material containing one element selected from the group consisting of Ni, Cu, Co, Al, and Fe is preferably used. Of those, an inorganic material containing Fe as its main component is preferable. More specifically, stainless steel, Kovar®, Fe—Ni alloy, an inorganic material made of Fe, or the like is more preferable. With this arrangement, the holding member 302 and the pressing part 309 can be firmly fixed by welding. In the present specification, the term "welding" refers to integrally bonding two members with continuity therebetween by applying heat and/or pressure etc.

Optical Member 304

Figure 3A:
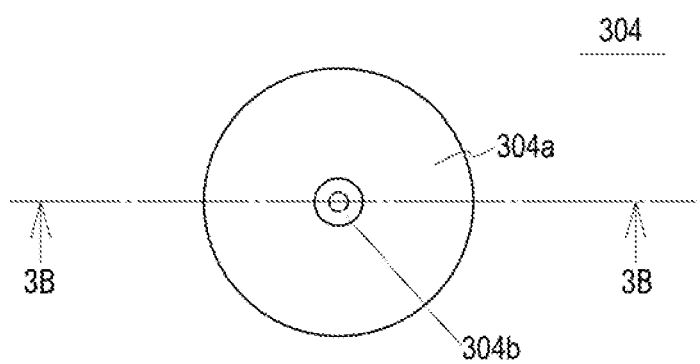
FIG. 3A is a schematic plan view of an optical member according to the first embodiment of the present invention.
Figure 3B:
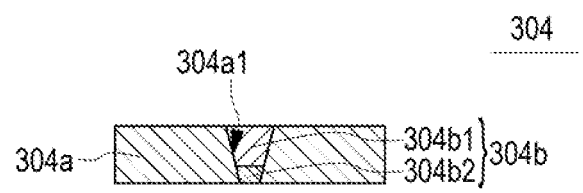
FIG. 3B is a cross sectional view taken along line 3B-3B in FIG. 3A.

FIG. 3A is a schematic plan view of the optical member according to the first embodiment and FIG. 3B is a cross sectional view taken along line 3B-3B in FIG. 3A. As shown in FIG. 1B and FIG. 1C, the light-transmissive part 304b of the optical member 304 is configured to allow at least a portion of light entering the through-hole 302b of the holding member 302 to pass through. The optical member 304 is disposed in the recess 302a of the holding member 302. The shape of the optical member 304 can be selected from various shapes such as a flat plate-like shape, a plate-like shape with a protruded portion, a housing-like shape, a case-like shape, or the like. The optical member 304 can be formed with an appropriate thickness, preferably greater than or equal to 0.2 mm in view of strength of the optical member 304 and preferably less than or equal to 2 mm in view of a reduction in size of the optical member holding device 30.

As shown in FIG. 3A and FIG. 3B, the optical member 304 includes, for example, a light-reflecting part 304a and a light-transmissive part 304b. With this arrangement, the elastic member 306 can be disposed on the upper surface of the light-reflecting part 304a. Accordingly, the elastic member 306 can be disposed on the upper surface of the optical member 304 without interrupting light passing through the light-transmissive part 304b. The light-reflecting part 304a may be formed with a through-hole 304a1 and the light-transmissive part 304b may be disposed in the through hole 304a1. The through-hole 304a1 can be defined by, for example, a polygonal columnar shape, a conical or pyramidal shape, or a shape which is a combination of those. The through-hole 304a1 may be formed with the same opening diameter throughout the thickness direction of the optical member 304 but is preferably formed such that one or more inner lateral surfaces of the light-reflecting part defining the through hole incline either continuously or stepwise with the opening diameter increasing upward. Accordingly, light traveling toward the one or more inner lateral surfaces defining the through hole 304a1 can be reflected upward at the one or more inner lateral surface, facilitating efficiently extracting the light outside of the optical member 304.

The through hole 304a1 formed in the light-reflecting part 304a may be defined with an opening in a circular shape, an elliptic shape, or a polygonal shape such as a triangular shape, a quadrangular shape, or the like. Unless specifically indicated, "opening" referred to in this paragraph and the next paragraph refers to the openings at the light-entering side and the light-emitting side. In particular, in order to be in conformity to the shape of light from the semiconductor laser element 16, a circular shape or an elliptic shape is preferable.

The opening diameter or width of the through-hole 304a1 formed in the light-reflecting part 304a is preferably greater than or equal to 0.1 mm. With such an opening diameter or width, light from the semiconductor laser element 16 can be easily directed to the through-hole 304a1 via the opening at the light-entering side. The opening diameter or width of the through-hole 304a1 formed in the light-reflecting part 304a is preferably less than or equal to 6.5 mm. With such an opening diameter or width, a reduction in luminance of the semiconductor laser device 1 caused by a large opening at the light-emitting side can be avoided.

The one or more inner lateral surfaces of the light-reflecting part 304a defining the through-hole 304a1 can be provided with a light-reflecting film. Thus, light propagating toward the one or more inner lateral surfaces defining the through-hole 304a1 can be reflected at the light-reflecting film and extracted to the outside of the optical member 304. For the light-reflecting film, aluminum, silver, a dielectric multilayer film, or the like can be used.

For the light-reflecting part 304a, an inorganic material having high reflectance, good thermal conductivity, and good heat-resisting properties is preferably used. In the present specification, the expression "a material having high reflectance" refers to a material that can reflect, for example, 50% or greater, preferably 60% or greater, more preferably 80% or greater of light emitted from the semiconductor laser element 16. With the use of such a material, a larger quantity of light propagating toward the one or more inner lateral surfaces defining the through-hole 304a1 can be reflected and extracted to the outside of the optical member 304. In the present specification, the expression "a material having good thermal conductivity" refers to a material having a thermal conductivity of, for example, several watts per meter per Kelvin (W/(m·K)) or greater, preferably 10 W/(m·K) or greater, more preferably 25 W/(m·K) or greater. With the use of such a material, heat from the optical member 304 can be dissipated efficiently to the holding member 302. In the present specification, the expression "a material having good heat-resisting properties" refers to a material having a melting point of, for example, several hundred Celsius degrees or greater, preferably a thousand Celsius degrees (1,000° C.) or greater. The optical member 304 is designed to be irradiated with a laser light which tends to cause the optical member 304 to have a relatively high temperature. Thus, the optical member 304 is preferably made of a material having good heat-resisting properties.

Examples of such an inorganic material include ceramics, a metal, or a composite of ceramics and metal. Examples of the ceramics include, silicon carbide, aluminum oxide, silicon nitride, aluminum nitride, titanium oxide, and zirconium oxide. Examples of the metal include high melting point metals such as aluminum, iron, copper, stainless steel, and Kovar®.

The light-transmissive part 304b allows light emitted from the semiconductor laser element 16 to pass through. In the present specification, "allows light emitted from the semiconductor laser element 16 to pass through" refers to a transmittance of 80% or greater, preferably 95% or greater of the light emitted from the semiconductor laser element 16.

The light-transmissive part 304b preferably consists of an inorganic material. In the present specification, examples of such an inorganic material include borosilicate glass, soda-lime glass, soda glass, lead glass, borosilicate glass containing a fluorescent material, soda-lime glass containing a fluorescent material, soda glass containing a fluorescent material, lead glass containing a fluorescent material, a sintered article formed by sintering a fluorescent material, a sintered article formed by sintering a mixture of a fluorescent material and a sintering aid, and a single crystal of a fluorescent material.

For the fluorescent material, a fluorescent material that can absorb light emitted from the semiconductor laser element 16 and converts it to light of different wavelength can be used. Examples of the fluorescent material include an yttrium aluminum garnet (YAG) activated with cerium, a lutetium aluminum garnet (LAG) activated with cerium, a nitrogen-containing calcium aluminosilicate (CASN or SCASN) activated with cerium and/or chromium, a silicate ((Sr, Ba)$_2$SiO$_4$) activated with europium, an α-sialon-based fluorescent material, a β-sialon-based fluorescent material, and a KSF-based fluorescent material.

Examples of sintering aid include aluminum oxide, silicon oxide, and titanium oxide.

The light-transmissive part 304b can have a thickness for example in a range of 0.01 mm to 1 mm, preferably in a range of 0.05 mm to 0.5 mm. The light-transmissive part 304b may have a single-layer structure or a multi-layer structure formed with a single material or different materials. In the first embodiment, the light-transmissive part 304b has a two-layer structure formed with a first light-transmissive part 304b1 and a second light-transmissive part 304b2 made of different materials.

An upper surface of the light-transmissive part 304b is preferably coplanar with (including approximately coplanar with) an upper surface of the light-reflecting part 304a. With this configuration, light can be prevented from spreading in a lateral direction from the light-transmissive part 304b, which, allows obtaining high luminance of the semiconductor laser device 1.

Elastic Member 306

Figure 4A:
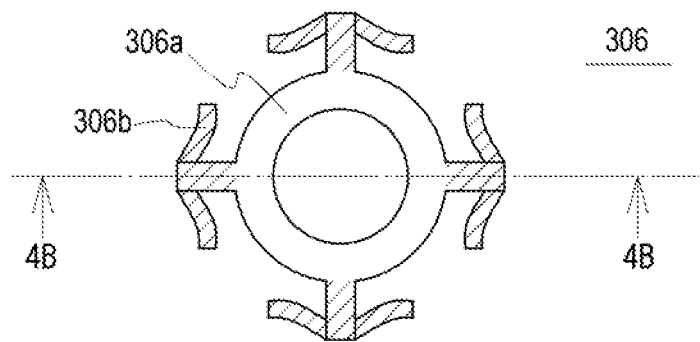
FIG. 4A is a schematic plan view of an elastic member according to the first embodiment of the present invention.
Figure 4B:
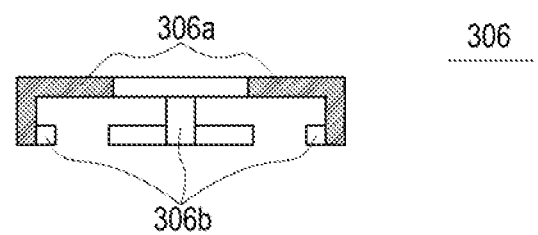
FIG. 4B is a schematic sectional view taken along 4B-4B in FIG. 4A.

FIG. 4A is a schematic plan view of the elastic member 306 according to the first embodiment, and FIG. 4B is a cross sectional view taken along line 41-41B in FIG. 4A. As shown in FIG. 4A and FIG. 4B, the elastic member 306 includes a main part 306a and a plurality of supporting parts 306b. In FIG. 4A, hatching is used to indicate the supporting parts 306b. As shown in FIG. 1B and FIG. 1C, each of the plurality of supporting parts 306b extends outward from the main part 306a and is subsequently bent downward. This allows transforming of the elastic member 306, bringing the plurality of the supporting parts 306b in contact with the one or more lateral surfaces of the recess 302a of the holding member 302 and the one or more lateral surfaces of the optical member 304. The elastic member 306 exerts elasticity (restoring force) resisting against the transformation to return to its original shape, but in the first embodiment, the elasticity is exerted to the optical member 304 and the holding member 302, securing the optical member 304 to a predetermined location in the recess 302a. In the present specification, the term "a predetermined location" refers to a location where the light-transmissive part 304b of the optical member 304 overlaps the through-hole 302b of the holding member 302. In order to simplify the design of the elastic member 306, the light-transmissive part 304b of the optical member 304 overlaps the through-hole 302b of the holding member 302 in the vicinity of the center of the recess 302a in a plan view. Further, with the use of the elastic member 306, the optical member 304 can be secured at a predetermined location in the recess 302a without directly fixing the optical member 304 to the holding member 302 as required in conventional technologies. Further, the difference in the thermal expansion coefficient between the optical member 304 and the holding member 302 may fluctuate a distance between the optical member 304 and the holding member 302, but even in the event of occurrence of such fluctuation, transformation of the elastic member 306 allows to retain the optical member 304 secured at the predetermined location in the recess 302a.

The plurality of supporting parts 306b of the elastic member 306 are preferably extended from the main part 306a outward in four directions or five or more directions and subsequently bent downward. This configuration allows exerting the elasticity of the elastic member 306 toward the optical member 304 so as to surround the optical member 304 from four directions or five or more directions such that the optical member 304 can be more stably secured at a predetermined location in the recess 302a.

The main part 306a of the elastic member 306 is disposed on the upper surface of the optical member 304. With this arrangement, heat from the optical member 304 can be more easily transferred to the holding member 302 compared to the case where the main part 306a is disposed on a lower surface of the optical member 304.

The main part 306a defines a through-hole in a center portion in a plan view. Accordingly, even when the elastic member 306 is disposed on the upper surface of the optical, member 304, light from the optical member 304 can be extracted to the outside. The shape defining the opening of the through-hole of the elastic member 306 is preferably in conformity to the shape defining the opening of the through-hole 304a1 of the light-reflecting part 304a such that when the shape defining the opening of the through-hole 304a1 of the light-reflecting part 304a is circular or elliptic, the shape defining the opening of the through-hole of the elastic member 306 is preferably circular or elliptic that is in conformity thereto. In a plan view, a distance between an opening edge of the through-hole 304a1 of the light-reflecting part 304a and an opening edge of the through-hole of the elastic member 306 is preferably greater than or equal to two times the thickness of the elastic member 306. With this arrangement, the possibility of the elastic member 306 blocking light from the optical member 304 can be reduced. In a plan view, a distance between an outer peripheral edge of the optical member 304 and an opening edge of the through-hole of the elastic member 306 is preferably greater than the thickness of the elastic member 306. With this arrangement, a contact area with the main part 306a of the elastic member 306 can be increased, and thus, detachment of the optical member 304 from the holding member 302 can be reduced.

Each of the supporting parts 306b can be bent downward and subsequently bent in a V-shape toward the optical member 304 in a plan view. With this arrangement, elasticity can be exerted against the optical member 304 from the one or more inner lateral surface of the supporting part 306b. In a plan view, parts that form each of the V-shapes preferably have a curved convex shape approaching the optical member 304. This arrangement allows more efficiently exerting the elasticity of the elastic member 306 toward the optical member 304 such that the optical member 304 can be more stably secured at a predetermined location in the recess 302a.

When the pressing part 309 is employed to press down the upper surface of the elastic member 306, the parts that form each of the V shapes are preferably in contact with a lower part of the optical member 304. With this arrangement, downward pressing by the pressing part 309 and lateral pressing of a lower portion of the optical member 304 by the elastic member 306 are simultaneously exerted such that the optical member 304 can be further stably secured at a predetermined location in the recess 302a. In the present specification, the term "a lower portion of the optical member 304" refers to, with respect to the height of the optical member 304, a lower half portion of the optical member 304, and the term "an upper portion of the optical member 304" refers to an upper half portion of the optical member 304. When the parts that form each of the V-shapes are designed to be in contact with the lower portion of the optical member 304, a relatively large distance is allowed between the main, part 306a and the edges of the supporting parts 306b of the elastic member 306 in a state before the supporting parts 306b are bent downward. This can facilitate formation of each end of the supporting parts 306b in a V-shape by way of press or the like.

In the first embodiment, the one or more outer lateral surfaces of each of the supporting parts 306b are in contact with the one or more lateral surfaces of the recess 302a of the holding member 302 and the one or more inner lateral surfaces of each of the supporting part 306b are made in contact with the one or more lateral surfaces of the optical member 304. With this arrangement, relatively greater area and greater number of the supporting parts 306b can be made in contact with the optical member 304, and thus the optical member 304 can be further stably secured to the predetermined location. More specifically, the elastic member 306 according to the first embodiment has a structure such that each of the supporting parts 306b is extended outward from the main part 306a and subsequently bent downward at a position above the one or more lateral surfaces of the recess 302a of the holding member 302. Each of the portions of the supporting part 306b bent downward is made in contact with the one or more lateral surfaces of the recess 302a of the holding member 302. Further, at the region where the supporting parts 306 are in contact with the one or more lateral surfaces of the recess 302a, portions of each of the supporting parts 306b are bent in a V-shape toward the optical member 304 in a plan view. Of the supporting parts 306b, a portion of each region that are bent in a V-shape in a plan view (i.e., a portion of one or more inner lateral surfaces of each of the supporting parts 306b) is in contact with the one or more outer lateral surfaces of the optical member 304.

The portions of the supporting parts 306b bent downward are preferably not in contact with the bottom surface of the recess 302a of the holding member 302. With this arrangement, the elastic member 306 can be easily disposed in the recess 302a of the holding member 302. It is also preferable that the ends of the V-shape of each of the supporting parts 306b in a plan view are not in contact with the one or more lateral surfaces of the recess 302a of the holding member 302. With this arrangement, the elastic member 306 can be easily disposed in the recess 302a of the holding member 302.

The supporting parts 306b are preferably fixed on respective corresponding portions of the wall 302c of the holding member 302. With this arrangement, even when the holding member 302 experiences external impact, securing of the optical member 304 at the predetermined location can be maintained. As illustrated in the first embodiment, when portions of the V-shape of each of the supporting parts 306b in a plan view are located near the lower portion of the optical member 304, i.e., near the bottom surface of the recess 302a, the supporting parts 306b are preferably welded to a region of the wall 302c corresponding to the lower portion of the optical member 304. With this arrangement, the optical member 304 can be more stably maintained at the predetermined location by the elastic member 306.

Moreover, in the first embodiment, the supporting parts 306b are in contact with corresponding portions of the lower portion of the optical member 304, which allows the wall 302c to have a relatively low height. Compared to the case where the wall 302c has a relatively high height, the size of the optical member holding device 30 can be reduced.

Fixing the supporting parts 306b by way of welding or the like can be applied to the entire surface (including approximately the entire surface) of the wall 302c of the recess 302a, but it is preferably applied to a portion of the wall 302c, for example, to a lower portion of the wall 302c. With this arrangement, the area of applying the welding can be reduced, i.e., the step of welding can be reduced, which allows an improvement in productivity.

The elastic member 306 consists of an inorganic material. With this arrangement, reliability can be improved in terms of heat dissipating properties and mechanical strength. Examples of the inorganic material include metal material such as aluminum, iron, and copper or the like. In the present specification, the expression "a member consists of an inorganic material" indicates that the member does not contain a material other than an inorganic material, that is, an organic material is not contained.

As in the first embodiment, when the light-transmissive portion 304b contains a fluorescent material, light from the semiconductor laser element 16 tends to cause a high temperature in the optical member 304 compared to the case where the light-transmissive part 304d does not contain a fluorescent material. For this reason, with the use of the elastic member 306 consisting of an inorganic material that has relatively superior heat-resisting properties and thermal conductivity, heat from the optical member 304 can be efficiently dissipated to the holding member 302 via the elastic member 306.

The elastic member 306 of the first embodiment can be obtained by, for example, applying punching or the like on a flat plate consisting of an inorganic material to obtain a flat shaped elastic member 306, and applying press or the like to form the portions to be the supporting parts 306b in a three-dimensional shape so as to create a V-shape, and bending the supporting parts 306b downward.

The elastic member 306 preferably has a thickness in a range of greater than or equal to 0.1 mm and less than or equal to 0.3 mm.

Pressing Part 309

Figure 5A:
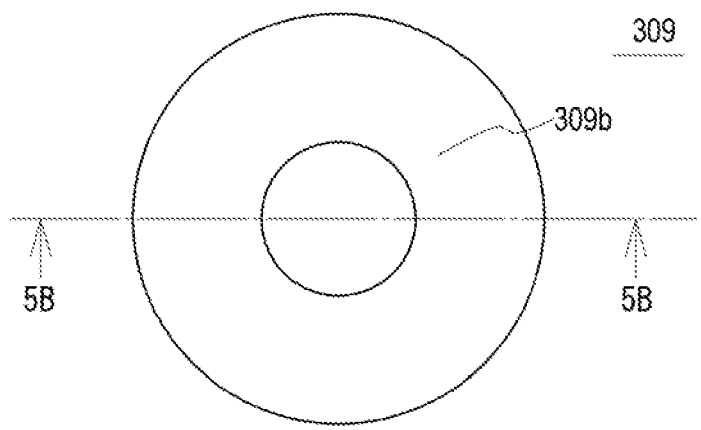
FIG. 5A is a schematic plan view of a pressing part according to the first embodiment of the present invention.
Figure 5B:
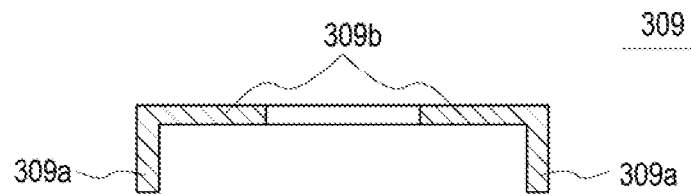
FIG. 5B is a cross sectional view taken along line 5B-5B in FIG. 5A.

FIG. 5A is a schematic plan view of the pressing part 309 according to the first embodiment, and FIG. 5B is a cross sectional view taken along line 5B-5B in FIG. 5A. As shown in FIG. 1B and FIG. 1C, the pressing part 309 is configured to press down the optical member 304 from above. As illustrated in the first embodiment, the pressing part 309 can be placed on the upper surface of the elastic member 306 to press down from above the optical member 304 via the upper surface of the elastic member 306. The pressing part 309 is fixed to the holding member 302.

In the first embodiment, the pressing part 309 includes a portion for fixing 309a which is fixed to the one or more outer lateral surfaces of the pressing part 302, and a portion for pressing 309b which extends inside from above the one or more outer lateral surfaces of the holding member 302 over the optical member 304 and the elastic member 306, and placed on the upper surface of the elastic member 306, and presses the optical member 304 from above via the upper surface of the elastic member 306. The portion for fixing 309a has a tube-shape surrounding the one or more outer lateral surfaces of the holding member 302. The portion for pressing 309b may have a plurality of hook shape parts extending from the portion for fixing 309a onto the upper surface of the elastic member 306, but it is preferable for the portion for pressing 309b to have a tube shape that can press the upper surface of the outer periphery of the main part 306a of the elastic member 306 in its entirety. With this shape, the optical member 304 can be stably secured.

In a plan view, a length between an inner edge of the portion for pressing 309b and an outer edge of the optical member 304 is smaller than a length between an outer edge of the optical member 304 and the through-hole 304a1 of the optical member 304. For example, when the length between an inner edge of the portion for pressing 309b and an outer edge of the optical member 304 is greater than or equal to 1/40 of the total width or the total length of the optical member 304, pressing of the elastic member 306 and the optical member 304 by the pressing part 309 can be facilitated. When the length between an inner edge of the portion for pressing 309b and an outer edge of the optical member 304 is less than or equal to 1/5 of the total width or the total length of the optical member 304, the distance between the portion for fixing 309a and an inner edge of the portion for pressing 309b can be reduced, which can reduce or prevent the pressing part 309 from being lifted by the optical member 304.

In a plan view, the main part 306a of the elastic member 306 is preferably located, inward of the pressing part 309. With this arrangement, when the elastic member 306 is disposed at a location difficult to block light from the optical member 304, the pressing part 309 is also at a location difficult to block light from the optical member 304.

The pressing part 309 can be fixed to the holding member 302 by welding or soldering. In the first embodiment, the pressing part 309 and the holding member 302 are fixed by welding. With this arrangement, the joint portion of the pressing part 309 and the holding member 302 is integrally attached with continuous joining, allowing firm fixing of the pressing part 309 and the holding member 302.

The pressing part 309 can be made of an inorganic material similar to those shown for the holding member 302, and a material containing iron as its main component is preferably used. With the use of such a material, the holding member 302 and the pressing part 309 can be fixed by welding.

Base 10

The semiconductor laser elements 16 is fixed to the base 10 directly or via a sub-mount 14 or the like. A material containing an insulating material such as aluminum nitride, silicon carbide, and aluminum oxide, and/or a metal can be used for the base 10.

The shape and size of the base 10 can be appropriately adjusted according to the shape, size, or the like required for the semiconductor laser device 1. The base 10 can be formed in a circular shape, an elliptical shape, a polygonal shape such as a rectangular shape, or a shape similar to one or more of those. For example, a circular plate-like shape with a diameter in a range of 3 mm to 11 mm may be employed. The upper surface of the base 10 may be provided with a recess and/or a protrusion. The base 10 can have a thickness in a range of 0.5 mm to 5 mm. The base 10 is generally provided with one or more terminals 12 such as lead terminals 12 to be connected to an external power source.

Semiconductor Laser Element 16

The semiconductor laser element 16 is disposed above the base 10. In the first embodiment, the semiconductor laser element 16 is disposed on a heat sink 11 via the sub-mount 14, and the heat sink 11 is disposed on the upper surface of the base 10. Light emitted from the semiconductor laser element 16 passes through the through-hole 18a of the cover 18 and the through-hole 302b of the holding member 302 and enters the light-transmissive part 304b of the optical member 304.

The semiconductor laser element 16 is configured to emit a laser light. The semiconductor laser element 16 having an emission peak wavelength, for example, in range of 300 nm to 500 nm, preferably in a range of 400 nm to 470 nm, more preferably in a range of 420 nm to 470 nm can be employed. A nitride semiconductor (GaN-based semiconductor) can be used for blue light emitting semiconductor laser element 16. The semiconductor laser element 16 has an active layer between an n-type semiconductor layer and a p-type semiconductor layer.

The semiconductor laser element 16 can be fixed via a sub-mount 14 to the heatsink 11, which is disposed on the upper surface of the base 10. The sub-mount 14 is preferably made of a material having high thermal conductivity in order to dissipate heat from the semiconductor laser element 16. More specifically, aluminum nitride, silicon carbide, or silicon can be used for the sub-mount 14. In the first embodiment, aluminum nitride is used for the sub-mount 14.

Cover 18

The cover 18 is disposed above the base 10. A through-hole 18a is formed on an upper part of the cover 18 to allow light from the semiconductor laser element 16 to pass through. The through-hole 18a formed in the cover 18 may have the same diameter through a thickness direction of the cover 18, or may have a diameter which decreases upward. In the first embodiment, the through-hole 18 has a diameter decreasing upward. With this arrangement, sufficient connecting area between the cover 18 and the optical member holding device 30 can be obtained without intercepting the laser light. Accordingly, dissipation of heat generated in the optical member holding device 30 to the cover 18 can be facilitated.

The cover 18 can be formed in, for example, a cylindrical shape with a bottom or top surface (a circular cylindrical shape, a polygonal cylindrical shape, or the like), a frustum shape (a truncated cone shape, a polygonal pyramid shape, or the like), a dome shape, or an altered shape of those. The upper surface of the cover 18 and the lower surface of the holding member 302 are preferably flat surfaces, in particular, preferably in parallel to the upper surface of the base 10. With this arrangement, alignment of light from the semiconductor laser element 16 and the optical member holding device 30 can be facilitated.

The cover 18 preferably consists of an inorganic material similar to that used for the holding member 302. When the cover 18 and the holding member 302 are respectively made of a material containing iron as its main component, the cover 18 and the holding member 302 can be fixed to each other by welding. When the cover 18 and the base 10 are respectively made of a material containing iron as its main component, the cover 18 and the base 10 can be fixed to each other by welding.

The cover 18 and the holding member 302 may be formed integrally with a single member. However, as described in the first embodiment, the cover 18 and the holding member 302 may be formed by different members. When the cover 18 and the holding member 302 are formed by different members as in the first embodiment, positional adjustment of the focal point position of the laser light from the semiconductor laser element 16 with the through-hole 108a of the cover 18 and the through-hole 302b of the holding member 302 can be facilitated, and thus the laser light can be easily made incident to the optical member holding device 30.

Lens 22, Second Cover 20

A member such as a lens 22 to condense laser light may be provided between the semiconductor laser element 16 and the optical member holding device 30. Thus, light from the semiconductor laser element 16 can be easily directed to the through-hole 18a of the cover 18 and the through-hole 302b of the holding member 302. In the first embodiment, a second cover 20 is disposed inward of the cover 18 and a lens 22 is disposed on the second cover 20. The region inside the second cover 20 where the semiconductor laser element 16 is disposed is hermetically sealed by the second cover 20, the lens 22, and the base 10. The semiconductor laser element 16 using a semiconductor material for emitting short wavelength light with a main oscillation wavelength in a range of 320 nm to 530 nm exhibits high light density. Thus, this tends to attract dust to the light emission surface of the semiconductor laser element 16. But with the use of the second cover 20, the lens 22, and the base 10, the semiconductor laser element 16 is enclosed to enhance hermeticity in the laser device, and thus accumulation of dust attracted to the light emission surface and in the vicinity thereof can be further reduced or prevented. Alternatively, the lens 22 may be disposed on the cover 18 to hermetically seal the region where the semiconductor laser element 16 is disposed, by the cover 18, the lens 22, and the base 10.

As described above, according to the first embodiment, an optical member 304 can be secured with the use of the elastic member 306 consisting of an inorganic material. Thus, the optical member holding device 30 and the semiconductor laser device 1 with high reliability in terms of heat-resisting properties and mechanical strength can be provided. Further, the optical member 304 can be secured at a predetermined location in the recess 302a of the holding member 302 without directly fixing the optical member 304 and the holding member 302.

Semiconductor Laser Device 2

According to Second Embodiment

Figure 6A:
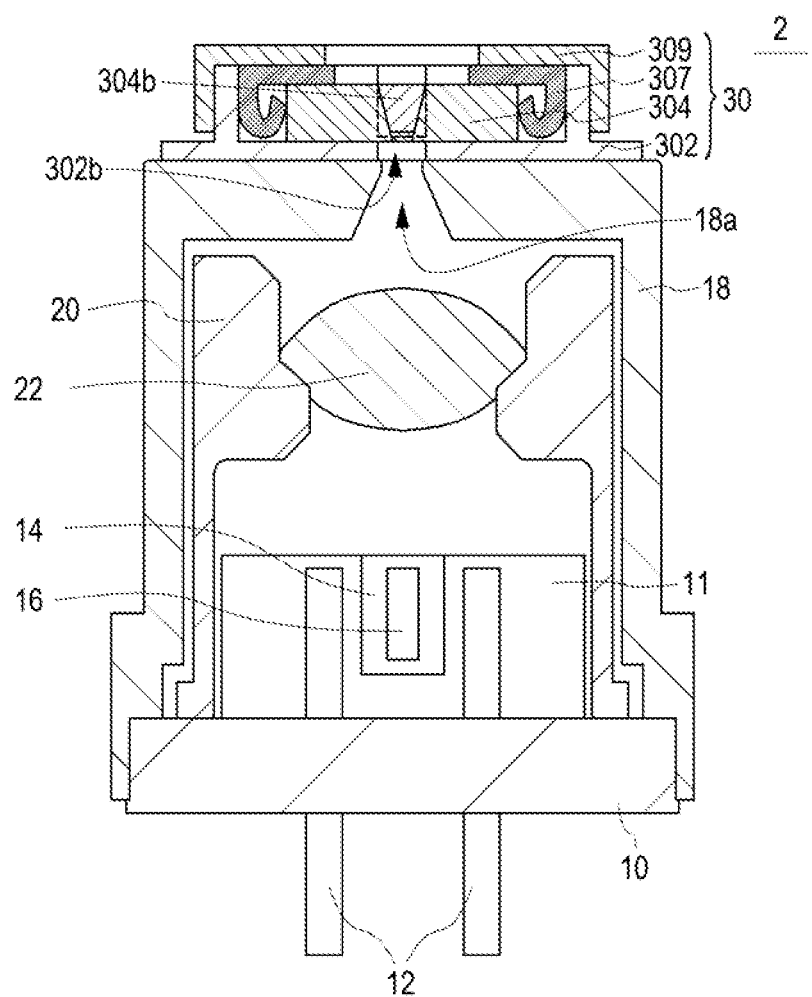
FIG. 6A is a schematic cross-sectional view of a semiconductor laser device according to a second embodiment of the present invention.
Figure 6B:
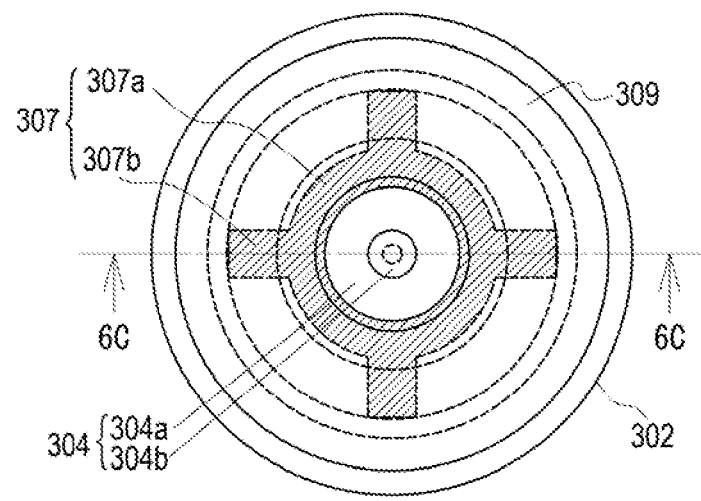
FIG. 6B is a schematic plan view of an optical member holding device according to the second embodiment of the present invention.
Figure 6C:
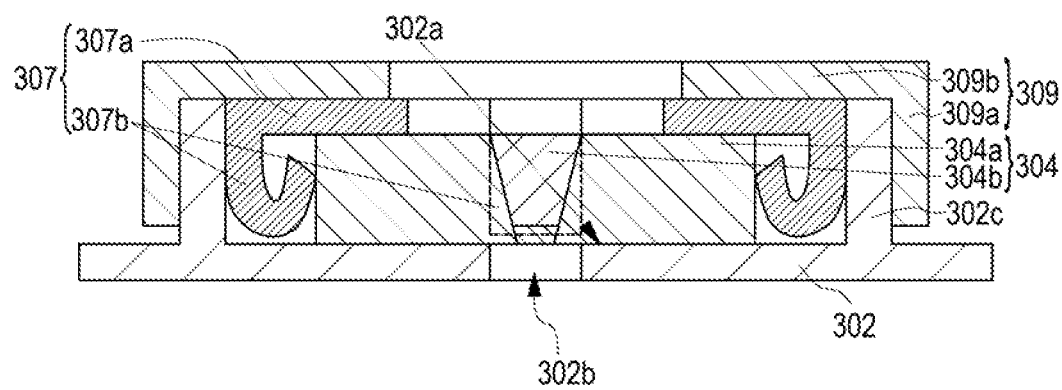
FIG. 6C is a cross sectional view taken, along line 6C-6C in FIG. 6B.
Figure 7A:
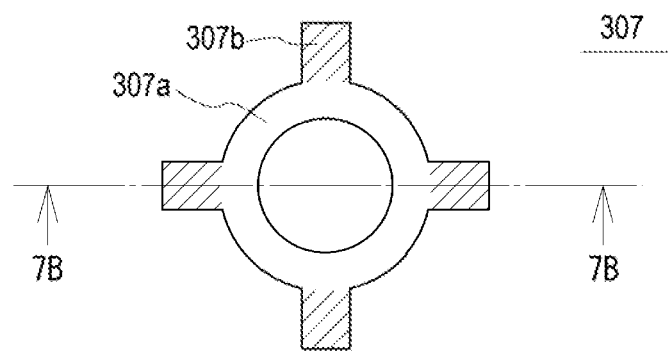
FIG. 7A is a cross-sectional view of an elastic member according to the second embodiment of the present invention.
Figure 7B:
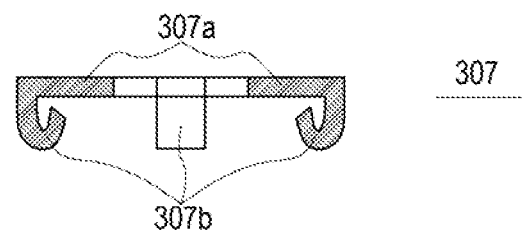
FIG. 7B is a cross sectional view taken along line 7B-7B in FIG. 7A.

FIG. 6A is a schematic cross-sectional view of a semiconductor laser device 2 according to a second embodiment of the present invention. FIG. 6B is a schematic plan view of an optical member holding device 30 according to the second embodiment, and FIG. 6C is a cross sectional view taken along line 6C-6C in FIG. 6B. In FIG. 6B, hatching is used to indicate an elastic member 307. FIG. 7A is a schematic plan view of the elastic member 307 according to the second embodiment, and FIG. 7B is a cross sectional view taken along line 7B-7B in FIG. 7A. In FIG. 7A, hatching is used to indicate supporting parts 307b.

As shown in FIG. 6A to FIG. 7B, the semiconductor laser device 2 according to the second embodiment differs from the semiconductor laser device 1 according to the first embodiment, in that, the supporting parts 307b of the elastic member 307 are bent downward and subsequently bent inwardly upward. In other words, each of the supporting parts 307b includes a distal end portion that is bent inwardly upward as shown in FIG. 7B. Similar to that of the first embodiment, according to the second embodiment, an optical member 304 can be secured with the use of the elastic member 307 consisting of an inorganic material. Thus, the optical member holding device and the semiconductor laser device with high reliability in terms of heat-resisting properties and mechanical strength can be provided. Further, according to the second embodiment, a need of spreading the supporting parts 307b outward before placing the elastic member 307 in the recess 302a of the holding member 302 can be eliminated, and thus the elastic member 307 can be easily placed in the recess 302a.

The portions of the supporting parts 307b bent downward preferably extends downward while being in contact with the one or more lateral surface(s) defining the recess 302a of the holding member 302. With this arrangement, a contact area between the elastic member 307 and the holding member 302 can be increased, which can facilitate securing the elastic member 307 in the recess 302a. This configuration also allows the portions of the supporting parts 307b that are in contact with the lateral surface(s) defining the recess 302a to be fixed to the wall 302c defining the recess 302a by welding, which allows retaining of the elastically deformed shape of the elastic member 307 and thus elastic force of the elastic member 307 can be continuously exerted to the optical member 304. In the second embodiment, the supporting parts 307b of the elastic member 307 are welded to the wall 302c defining the recess 302a, preferably in a region of the wall 302c corresponding to an upper portion of the optical member 304. With this arrangement, compared to the case where the vicinity of the portion where supporting parts 307b are bent inwardly upward are welded to the wall 302c, in other words, where the vicinity of the portion of the supporting parts 307b corresponding to the bottom surface of the recess 302a are welded to the wall 302c, retaining of elastic power of the elastic member 307 to the optical member 304 can be further facilitated. In the second embodiment, the supporting parts 307b are welded to the wall 302c defining the recess 302a at a region corresponding to the upper portion of the optical member 304. For this configuration, the wall 302c defining the recess 302a is set higher than that in the first embodiment.

The portions of the supporting parts 307b bent downward may be in contact with the bottom surface of the recess 302a, but are preferably not in contact with the bottom surface of the recess 302a. With this arrangement, compared to the case where the supporting parts 306b are in contact with the bottom surface of the recess 302a, the optical member 304 can be more easily secured by the elastic member 307 to the predetermined location.

At each of the supporting parts 307b, the portion subsequently being bent inwardly upward after the supporting parts 307b are bent downward preferably has a curved surface protruding toward the optical member 304. More specifically, each of the supporting part 307b is preferably such that it obliquely extends toward and is in contact with the corresponding portion of the lateral surface of the optical member 304, then turns away from the optical member 304, and obliquely extends toward the corresponding portion of the inner lateral surface defining the recess 302a. With this configuration, the end portion of each of the supporting parts 307b can be made less likely to be in contact with the optical member 304, and therefore the possibility of damaging the optical member 304 by the end portion of the supporting part 307b can be prevented or reduced.

The portions of the supporting parts 307b bent inwardly upward may extend in parallel to corresponding portions of the lateral surface(s) of the optical member 304, while being in contact with the optical member 304. With this arrangement, a contact area between the elastic member 307 and optical member 304 can be increased, which facilitates securing of the elastic member 307 in the recess 302a more stably.

The corner of the end portions of each of the supporting parts 307b of the elastic member 307 that are bent inwardly upward may be in contact with the optical member 304.

The elastic member 307 can be obtained by, for example, applying punching or the like on a flat plate consisting of an inorganic material to obtain a flat shaped elastic member 307, bending the end portions of the supporting parts 307b of the elastic member 307 (which may be bent twice according to a predetermined bending shape) and then bending the supporting part 307b downward.

Semiconductor Laser Device 3 According to Third Embodiment

Figure 8A:
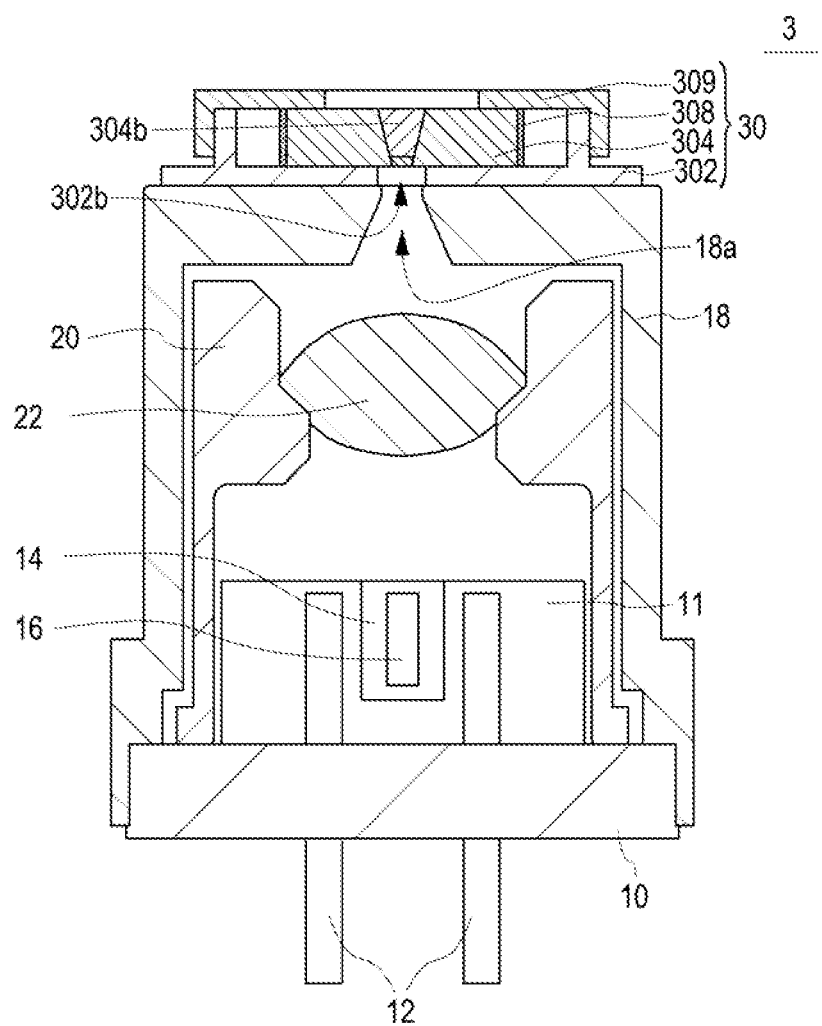
FIG. 8A is a schematic cross-sectional view of a semiconductor laser device according to a third embodiment of the present invention.
Figure 8B:
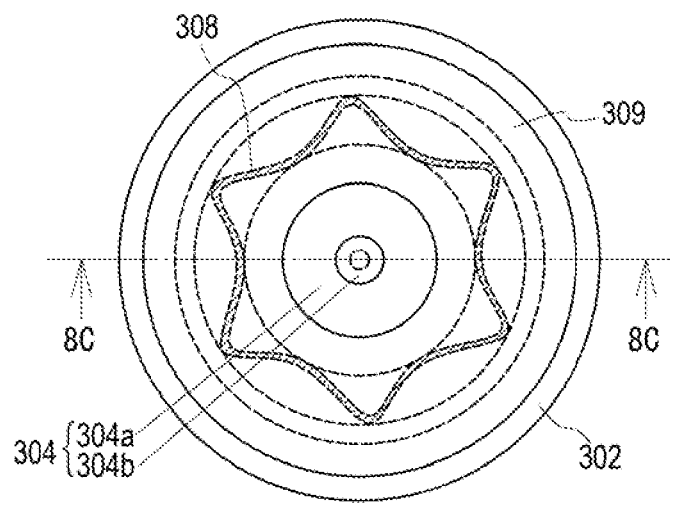
FIG. 8B is a schematic plan view of an optical member holding device according to the third embodiment of the present invention.
Figure 8C:
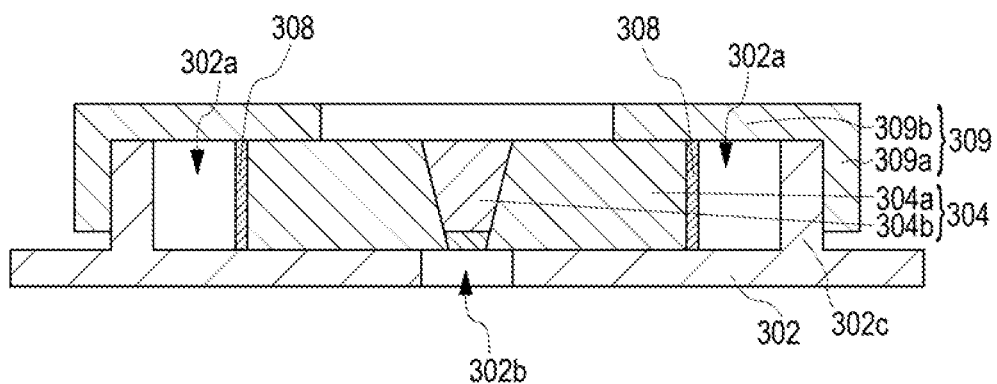
FIG. 8C is a cross sectional view taken along line 8C-8C in FIG. 8B.

FIG. 8A is a schematic cross-sectional view of a semiconductor laser device 3 according to a third embodiment of the present invention. FIG. 8B is a schematic plan view of an optical member holding device 30 according to the third embodiment, and FIG. 8C is a cross sectional view taken along line 8C-8C in FIG. 8B. In FIG. 83, hatching is used to indicate an elastic member 308.

As shown in FIG. 8A to FIG. 8C, the semiconductor laser device 3 according to the third embodiment differs from the semiconductor laser device 1 of the first embodiment, in that, the semiconductor laser device 3 includes the elastic member 308 having a wavelike shape and is disposed between inner lateral surface(s) defining a recess 302a and lateral surface(s) of an optical member 304. The elastic member 308 is in contact with the inner lateral surface(s) defining the recess 302a and with the lateral surface(s) of the optical member 304 such that the optical member 304 is secured by elastic force of the elastic member 308 at a predetermined location in the recess 302a. Similar to that of the first embodiment, according to the third embodiment, an optical member 304 can be secured with, the use of the elastic member 308 consisting of an inorganic material. Thus, the optical member holding device 30 and the semiconductor laser device 3 with high reliability in terms of heat-resisting properties and mechanical strength can be provided.

In the third embodiment, the outer lateral surface(s) of the elastic member 308 is in contact with the inner lateral surface(s) defining the recess 302a of the holding member 302 and the inner lateral surface(s) of the elastic member 308 is in contact with the lateral surface(s) of the optical member 304. The elastic member 308 preferably includes more than or equal to three bent portions that are in contact with the inner lateral surface(s) defining the recess 302a. With this arrangement, the optical member 304 can be secured at a predetermined location in the holding member 302. The elastic member 308 preferably includes less than or equal to 15 bent portions that are in contact with the inner lateral surface(s) defining the recess 302a. With this arrangement, the elastic member 308 can be easily disposed in the recess 302a.

Two portions of the elastic member 308 respectively extending from the portion that is in contact with the inner lateral surface defining the recess 302a toward the optical member 304 create at an angle (an angle of the bent portion) in a range of 25 degrees to 120 degrees.

The elastic member 308 can be formed with, for example, a single flat spring. More specifically, the elastic member 308 of the present embodiment can be obtained by, applying punching or the like on a flat plate consisting of an inorganic material to obtain a flat elastic member 308, and applying pressing or the like to form bent portions of the elastic member 308. The elastic member 308 thus obtained is pressed in an annular shape and placed in the recess 302a In the third embodiment, the portion for pressing 309b of the pressing part 309 is brought in contact with the optical member 304 without having the elastic member 307 in between.

Figure 9A:
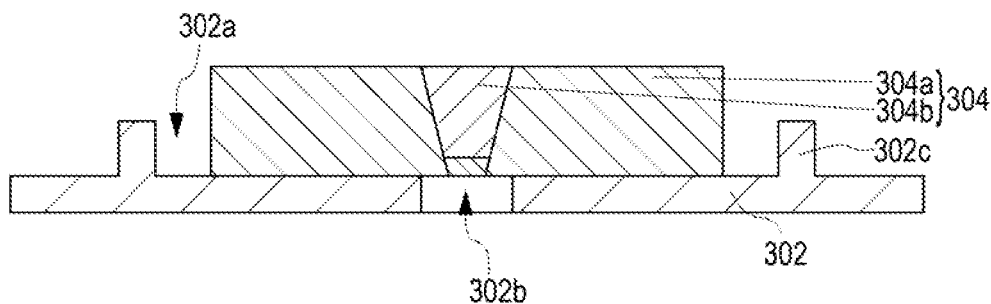
FIG. 9A is a schematic cross-sectional view illustrating a method of manufacturing an optical member holding device according to the first embodiment.
Figure 9B:
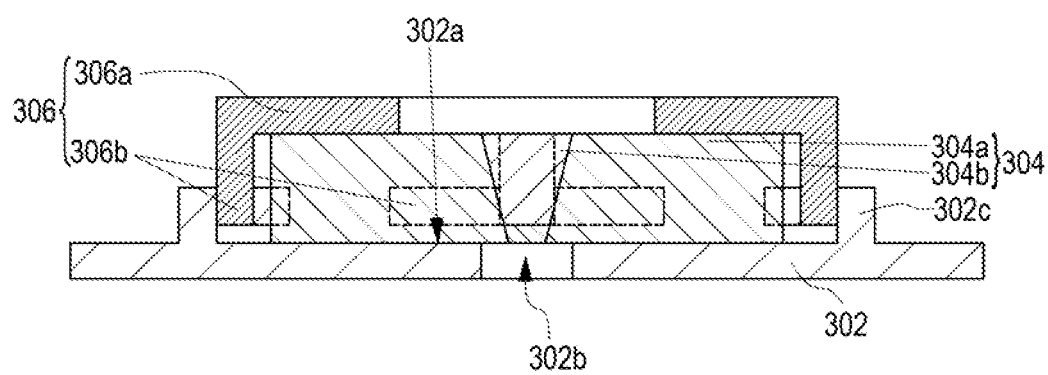
FIG. 9B is a schematic cross-sectional view illustrating the method of manufacturing the optical member holding device according to the first embodiment.
Figure 9C:
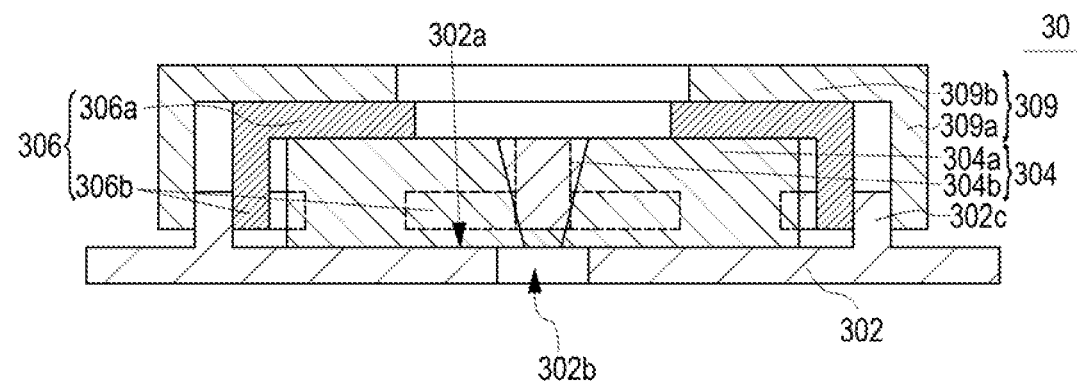
FIG. 9C is a schematic cross-sectional view illustrating the method of manufacturing the optical member holding device according to the first embodiment.

Method of Manufacturing Optical Member Holding Device 30 According to First Embodiment FIG. 9A to FIG. 9C are schematic cross-sectional views illustrating a method of manufacturing an optical member holding device 30 according to the first embodiment. The method of manufacturing the optical member holding device 30 according to the first embodiment includes providing a holding member 302 comprising a recess 302a and a through-hole 302b defined in a bottom surface defining the recess 302a, and an optical member 304 that includes a light-transmissive part 304b configured to allow at least a portion of light entering the through-hole 302b. The method also includes providing an elastic member 306 consisting of an inorganic material and includes a main part 306a and a plurality of supporting parts 306b that extend outward from the main part 306a and subsequently bent downward. Further the method includes disposing the optical member 304 in the recess 302a and disposing the main part 30 of the elastic member 306 on an upper surface of the optical member 304, bringing the plurality of supporting parts 306b in contact with corresponding portions of one or more inner lateral surfaces defining the recess 302a and one or more lateral surfaces of the optical member 304, securing the optical member 304 at a predetermined location in the recess 302a by using elasticity of the plurality of supporting parts 306b. The respective steps will be described below.

Providing Holding Member 302, Optical Member 304, and Elastic Member 306

The holding member 302 shown in FIG. 2A and FIG. 2B and an optical member 304 shown in FIG. 3A and FIG. 3B is provided. The holding member 302 is formed with the recess 302a defined by one or more inner lateral surfaces and a bottom surface, and a through-hole 302b is formed in the bottom surface. The optical member 304 includes the light-transmissive part 304b configured to allow at least a portion of light entering the through-hole 302b. The elastic member 306 shown in FIG. 4A and FIG. 4B is provided. The elastic member 306 consists of an inorganic material and includes a main part 306a and a plurality of supporting parts 306b that extend outward from the main part 306a and subsequently bent downward.

Disposing Optical Member 304 and Elastic Member 306

Then, as shown in FIG. 9A, the optical member 304 is disposed in the recess 302a and as shown in FIG. 9B, the elastic member 306 is disposed such that the main part 306a is disposed on an upper surface of the optical member 304, the plurality of supporting parts 306b is brought in contact with corresponding portions of one or more inner lateral surfaces defining the recess 302a and one or more lateral surfaces of the optical member 304, securing the optical member 304 at a predetermined location in the recess 302a by the elastic force exerted from the plurality of supporting parts 306b. With this arrangement, the optical member 304 can be secured at a predetermined location in the holding member 302 without a need of precise locational alignment between the optical member 304 and the holding member 302. Further, the optical member 304 can be secured at a predetermined location in the recess 302a of the holding member 302 without directly fixing the optical member 304 to the holding member 302. Further, even when the optical member holding device 300 experiences an external impact during a manufacturing step after disposing the optical member 304 and the elastic member 306, the optical member 304 is secured by the elastic member 306 to the predetermined location and therefore the possibility of positional shifting of the optical member 304 can be eliminated or reduced. The elastic member 306 can be disposed after disposing the optical member 304 in the recess 302a as in the present embodiment, but alternatively, the optical member 304 and the elastic member 306 can be combined with each other and then disposed in the recess 302a.

Securing Elastic Member 306

Welding the elastic member 306 and the wall 302c of the recess 302a may be performed after securing the elastic member 306 in the predetermined location in the recess 302a. With this arrangement, even when the optical member holding device 30 experiences an external impact, securing of the optical member 304 at the predetermined location can be maintained.

Fixing Hold-Down Part 309

Next, as shown in FIG. 9C, a step of fixing the pressing part 309 to the holding member 302 may be optionally performed. In the step of fixing, the portion for fixing 309a of the pressing part 309 is fixed to the wall 302c of the recess 302a by using, for example, laser welding, are welding, or resistance welding. If the holding member 302 and the elastic member 306 is fixed by welding at this point, it is preferable to also weld the supporting parts 306b of the elastic member 306 to the holding member 302 when welding the pressing part 309 and the holding member 302. With this arrangement, the number of welding steps can be reduced, which allows an improvement in productivity. For example, by placing the elastic member 306 at a location where the pressing part 309 and the holding member 302 are welded, the elastic member 306 can also be fixed by a single welding step.

The method of manufacturing the semiconductor laser device 2 according to the second embodiment and the method of manufacturing the semiconductor laser device 3 according to the third embodiment comprise mostly same steps as the method of manufacturing the semiconductor laser device 1 according to the first embodiment, except for employing elastic member of different shapes, and therefore repetitive description will be appropriately omitted.

Certain embodiments have been described above, but the scope of the invention is not limited to the above description and should be widely understood based on the scope of claim for patent.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. An optical member holding device comprising:
a holding member having a recess defined by one or more lateral surfaces and a bottom surface with a through-hole opening at the bottom surface of the recess;
an optical member disposed on the bottom surface of the recess, and including a light transmissive part configured to allow at least a portion of light that enters the through-hole of the holding member to pass through, the optical member having an upper surface and one or more lateral surfaces; and
an elastic member consisting of an inorganic material, the elastic member including
a main part disposed on the upper surface of the optical member, and
a plurality of supporting parts, each of the plurality of supporting parts extending outward from the main part and bending downward so as to be in contact with the one or more lateral surfaces of the recess and the one or more lateral surfaces of the optical member to exert elastic force that secures the optical member in a predetermined location in the recess.

2. The optical member holding device according to claim 1, wherein
each of the plurality of supporting parts includes
one or more outer lateral surfaces which is in contact with the one or more lateral surfaces of the recess, and
one or more inner lateral surfaces which is in contact with the one or more lateral surfaces of the optical member.

3. The optical member holding device according to claim 1, wherein
each of the plurality of supporting parts includes a distal end portion that is bent inwardly upward.

4. The optical member holding device according to claim 1, wherein
the elastic member has a thickness in a range of 0.1 mm to 0.3 mm.

5. The optical member holding device according to claim 1, wherein
the elastic member is fixed to the one or more lateral surfaces of the recess.

6. The optical member holding device according to claim 1, wherein
the holding member consists of an inorganic material.

7. The optical member holding device according to claim 1, further comprising
a pressing part fixed to the holding member so as to press the optical member downwards.

8. A semiconductor laser device comprising:
the optical member holding device according to claim 1;
a base;
a semiconductor laser element disposed above the base; and
a cover disposed above the base, the cover including an upper surface with a through-hole opening at the upper surface to allow light from the semiconductor laser element to pass through,
wherein the optical member holding device is disposed above the cover such that light emitted from the semiconductor laser element passes through the through-hole of the cover and the through-hole of the holding member to enter the light-transmissive part.

9. The semiconductor laser device according to claim 8, wherein
the cover consists of an inorganic material.

10. A method of manufacturing an optical member holding device comprising:
providing
a holding member having a recess defined by one or more lateral surfaces and a bottom surface with a through-hole opening at the bottom surface of the recess,
an optical member including a light-transmissive part configured to allow at least a portion of light that enters the through-hole of the holding member to pass through, the optical member having an upper surface and one or more lateral surfaces, and
an elastic member consisting of an inorganic material, the elastic member including a main part and a plurality of supporting parts with each of the plurality of supporting parts extending outward from the main part and bending downward; and
disposing the optical member in the recess of the holding member and disposing the main part of the elastic member on the upper surface of the optical member such that the plurality of the supporting parts are in contact with the one or more lateral surfaces of the recess and the one or more lateral surfaces of the optical member to exert elastic force that secures the optical member in a predetermined location in the recess.

11. The method of manufacturing an optical member holding device according to claim 10, wherein
the disposing of the elastic member includes disposing the plurality of supporting parts so that one or more outer lateral surfaces of each of the plurality of supporting parts is in contact with the one or more lateral surfaces of the recess, and
one or more inner lateral surfaces of the each of the plurality of supporting parts is in contact with the one or more lateral surfaces of the optical member.

12. The method of manufacturing an optical member holding device according to claim 10, wherein
the providing of the elastic member includes providing the elastic member so that each of the plurality of supporting parts includes a distal end portion that is bent inwardly upward.

13. A method of manufacturing a semiconductor laser device comprising:
providing the optical member holding device manufactured by the method according to claim 10;
providing a base, a semiconductor laser element, a cover having an upper surface with a through-hole opening at the upper surface to allow light from the semiconductor laser element to pass through;
disposing the semiconductor laser element above the base;
disposing the cover above the base such that light emitted from the semiconductor laser element passes through the through-hole of the cover; and
disposing the optical member holding device above the cover such that light emitted from the semiconductor laser element passes through the through-hole of the cover and the through-hole of the holding member to enter the light-transmissive part.

* * * * *